US008436336B2

(12) United States Patent
Lee et al.

(10) Patent No.: US 8,436,336 B2
(45) Date of Patent: May 7, 2013

(54) STRUCTURE AND METHOD FOR A HIGH-SPEED SEMICONDUCTOR DEVICE HAVING A GE CHANNEL LAYER

(75) Inventors: Minjoo L. Lee, Durham, NC (US); Christopher W. Leitz, Manchester, NH (US); Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 1192 days.

(21) Appl. No.: 11/877,186

(22) Filed: Oct. 23, 2007

(65) Prior Publication Data

US 2008/0128747 A1  Jun. 5, 2008

Related U.S. Application Data

(63) Continuation of application No. 10/173,986, filed on Jun. 18, 2002, now Pat. No. 7,301,180.

(60) Provisional application No. 60/299,139, filed on Jun. 18, 2001.

(51) Int. Cl.
*H01L 29/06* (2006.01)

(52) U.S. Cl.
USPC ............... 257/19; 257/18; 257/191; 257/192

(58) Field of Classification Search ............... 257/18–19, 257/191–192, 274
See application file for complete search history.

(56) References Cited

U.S. PATENT DOCUMENTS

| | | |
|---|---|---|
| 4,497,683 A | 2/1985 | Celler et al. |
| 4,692,992 A | 9/1987 | Hsu |
| 4,710,788 A | 12/1987 | Dambkes et al. |
| 4,920,076 A | 4/1990 | Holland et al. |
| 4,990,979 A | 2/1991 | Otto et al. |

(Continued)

FOREIGN PATENT DOCUMENTS

| | | |
|---|---|---|
| DE | 41 01 167 | 7/1992 |
| DE | 4101167 A1 | 7/1992 |

(Continued)

OTHER PUBLICATIONS

Bedair, "Atomic layer epitaxy deposition processes," J. Vac. Sci. Technol. B, 12(1):179-185 (1994).

(Continued)

*Primary Examiner* — Ori Nadav
(74) *Attorney, Agent, or Firm* — Goodwin Procter LLP

(57) ABSTRACT

The invention provides semiconductor structure comprising a strained Ge channel layer, and a gate dielectric disposed over the strained Ge channel layer. In one aspect of the invention, a strained Ge channel MOSFET is provided. The strained Ge channel MOSFET includes a relaxed SiGe virtual substrate with a Ge content between 50-95%, and a strained Ge channel formed on the virtual substrate. A gate structure is formed upon the strained Ge channel, whereupon a MOSFET is formed with increased performance over bulk Si. In another embodiment of the invention, a semiconductor structure comprising a relaxed Ge channel layer and a virtual substrate, wherein the relaxed Ge channel layer is disposed above the virtual substrate. In a further aspect of the invention, a relaxed Ge channel MOSFET is provided. The method includes providing a relaxed virtual substrate with a Ge composition of approximately 100% and a relaxed Ge channel formed on the virtual substrate.

18 Claims, 8 Drawing Sheets

U.S. PATENT DOCUMENTS

| | | |
|---|---|---|
| 5,079,447 A | 1/1992 | Lien et al. |
| 5,089,872 A | 2/1992 | Ozturk et al. |
| 5,155,571 A | 10/1992 | Wang et al. |
| 5,241,197 A | 8/1993 | Murakami et al. |
| 5,242,847 A | 9/1993 | Ozturk et al. |
| 5,266,510 A | 11/1993 | Lee |
| 5,266,521 A | 11/1993 | Lee et al. |
| 5,291,439 A | 3/1994 | Kauffmann et al. |
| 5,312,766 A | 5/1994 | Aronowitz et al. |
| 5,327,375 A | 7/1994 | Harari |
| 5,442,205 A | 8/1995 | Brasen et al. |
| 5,461,243 A | 10/1995 | Ek et al. |
| 5,479,033 A | 12/1995 | Baca et al. |
| 5,523,592 A | 6/1996 | Nakagawa et al. |
| 5,534,713 A | 7/1996 | Ismail et al. |
| 5,596,527 A | 1/1997 | Tomioka et al. |
| 5,617,351 A | 4/1997 | Bertin et al. |
| 5,683,934 A | 11/1997 | Candelaria |
| 5,739,567 A | 4/1998 | Wong |
| 5,777,347 A | 7/1998 | Bartelink |
| 5,780,922 A | 7/1998 | Mishra et al. |
| 5,786,612 A | 7/1998 | Otani et al. |
| 5,792,679 A | 8/1998 | Nakato |
| 5,808,344 A | 9/1998 | Ismail et al. |
| 5,847,419 A | 12/1998 | Imai et al. |
| 5,891,769 A | 4/1999 | Liaw et al. |
| 5,906,951 A | 5/1999 | Chu et al. |
| 5,951,757 A | 9/1999 | Dubbelday et al. |
| 5,963,817 A | 10/1999 | Chu et al. |
| 5,986,287 A | 11/1999 | Eberl et al. |
| 5,998,807 A | 12/1999 | Lustig et al. |
| 6,013,134 A | 1/2000 | Chu et al. |
| 6,058,044 A | 5/2000 | Sugiura et al. |
| 6,059,895 A | 5/2000 | Chu et al. |
| 6,096,590 A | 8/2000 | Chan et al. |
| 6,107,653 A | 8/2000 | Fitzgerald |
| 6,111,267 A | 8/2000 | Fischer et al. |
| 6,117,750 A | 9/2000 | Bensahel et al. |
| 6,130,453 A | 10/2000 | Mei et al. |
| 6,143,636 A | 11/2000 | Forbes et al. |
| 6,154,475 A | 11/2000 | Soref et al. |
| 6,204,529 B1 | 3/2001 | Lung et al. |
| 6,207,977 B1 | 3/2001 | Augusto |
| 6,228,694 B1 | 5/2001 | Doyle et al. |
| 6,235,568 B1 | 5/2001 | Murthy et al. |
| 6,249,022 B1 | 6/2001 | Lin et al. |
| 6,251,755 B1 | 6/2001 | Furukawa et al. |
| 6,266,278 B1 | 7/2001 | Harari et al. |
| 6,281,532 B1 | 8/2001 | Doyle et al. |
| 6,310,367 B1 | 10/2001 | Yagishita et al. |
| 6,326,664 B1 | 12/2001 | Chau et al. |
| 6,339,232 B1 | 1/2002 | Takagi |
| 6,350,993 B1 | 2/2002 | Chu et al. |
| 6,399,970 B2 | 6/2002 | Kubo et al. |
| 6,407,406 B1 | 6/2002 | Tezuka et al. |
| 6,437,375 B1 | 8/2002 | Beaman |
| 6,461,945 B1 | 10/2002 | Yu |
| 6,465,316 B2 | 10/2002 | Hattori et al. |
| 6,498,359 B2 * | 12/2002 | Schmidt et al. .......... 257/190 |
| 6,555,839 B2 | 4/2003 | Fitzgerald |
| 6,563,152 B2 | 5/2003 | Roberds et al. |
| 6,583,437 B2 | 6/2003 | Mizuno et al. |
| 6,593,191 B2 | 7/2003 | Fitzgerald |
| 6,593,625 B2 | 7/2003 | Christiansen et al. |
| 6,593,641 B1 | 7/2003 | Fitzergald |
| 6,600,170 B1 | 7/2003 | Xiang |
| 6,603,156 B2 | 8/2003 | Rim |
| 6,605,498 B1 | 8/2003 | Murthy et al. |
| 6,620,664 B2 | 9/2003 | Ma et al. |
| 6,621,131 B2 | 9/2003 | Murthy et al. |
| 6,646,322 B2 | 11/2003 | Fitzgerald |
| 6,649,480 B2 | 11/2003 | Fitzgerald et al. |
| 6,657,223 B1 | 12/2003 | Wang et al. |
| 6,677,192 B1 | 1/2004 | Fitzgerald |
| 6,693,641 B1 | 2/2004 | Fitzgerald |
| 6,703,648 B1 | 3/2004 | Xiang et al. |
| 6,703,688 B1 | 3/2004 | Fitzergald |
| 6,723,661 B2 | 4/2004 | Fitzgerald |
| 6,730,551 B2 | 5/2004 | Lee et al. |
| 6,737,670 B2 | 5/2004 | Cheng et al. |
| 6,743,684 B2 | 6/2004 | Liu |
| 6,759,695 B2 | 7/2004 | Ma et al. |
| 6,815,279 B2 | 11/2004 | Yagishita et al. |
| 6,861,318 B2 | 3/2005 | Murthy et al. |
| 6,885,084 B2 | 4/2005 | Murthy et al. |
| 6,900,094 B2 | 5/2005 | Hammond et al. |
| 6,916,694 B2 | 7/2005 | Hanafi et al. |
| 6,916,727 B2 | 7/2005 | Leitz et al. |
| 6,921,913 B2 | 7/2005 | Yeo et al. |
| 6,940,089 B2 | 9/2005 | Cheng et al. |
| 6,943,087 B1 | 9/2005 | Xiang et al. |
| 6,974,735 B2 | 12/2005 | Fitzgerald |
| 7,001,837 B2 | 2/2006 | Ngo et al. |
| 7,033,869 B1 | 4/2006 | Xiang et al. |
| 7,083,998 B2 | 8/2006 | Chu et al. |
| 7,138,649 B2 | 11/2006 | Currie et al. |
| 7,141,820 B2 | 11/2006 | Lee et al. |
| 7,145,167 B1 | 12/2006 | Chu |
| 7,161,206 B2 | 1/2007 | Oh et al. |
| 7,163,853 B2 | 1/2007 | Tu et al. |
| 7,176,537 B2 | 2/2007 | Lee et al. |
| 7,238,989 B2 | 7/2007 | Yeo et al. |
| 7,268,065 B2 | 9/2007 | Lin et al. |
| 7,301,180 B2 | 11/2007 | Lee et al. |
| 7,402,493 B2 | 7/2008 | Oh et al. |
| 7,462,522 B2 | 12/2008 | Chidambarrao et al. |
| 2001/0003364 A1 | 6/2001 | Sugawara et al. |
| 2001/0045582 A1 | 11/2001 | Schmidt et al. |
| 2002/0063292 A1 | 5/2002 | Armstrong et al. |
| 2002/0100942 A1 | 8/2002 | Fitzgerald et al. |
| 2002/0125471 A1 | 9/2002 | Fitzgerald et al. |
| 2002/0125497 A1 | 9/2002 | Fitzgerald |
| 2002/0140031 A1 | 10/2002 | Rim |
| 2002/0167048 A1 | 11/2002 | Tweet et al. |
| 2002/0190284 A1 | 12/2002 | Murthy et al. |
| 2003/0013323 A1 | 1/2003 | Hammond et al. |
| 2003/0057439 A1 | 3/2003 | Fitzgerald |
| 2003/0227013 A1 | 12/2003 | Currie et al. |
| 2004/0007724 A1 | 1/2004 | Murthy et al. |
| 2004/0014276 A1 | 1/2004 | Murthy et al. |
| 2004/0026765 A1 | 2/2004 | Currie et al. |
| 2004/0119101 A1 | 6/2004 | Schrom et al. |
| 2005/0017236 A1 | 1/2005 | Sugii et al. |
| 2005/0151164 A1 | 7/2005 | Leitz et al. |
| 2005/0221550 A1 | 10/2005 | Fitzgerald |
| 2006/0071285 A1 | 4/2006 | Datta et al. |
| 2006/0266997 A1 | 11/2006 | Currie et al. |
| 2007/0032009 A1 | 2/2007 | Currie et al. |
| 2007/0072354 A1 | 3/2007 | Lee et al. |
| 2007/0080409 A1 | 4/2007 | Seliskar |
| 2008/0206961 A1 | 8/2008 | Sugii et al. |
| 2008/0242075 A1 | 10/2008 | Oh et al. |

FOREIGN PATENT DOCUMENTS

| | | |
|---|---|---|
| EP | 0683522 A2 | 11/1995 |
| EP | 0 828 296 | 3/1998 |
| EP | 0 829 908 | 3/1998 |
| EP | 0829908 A2 | 3/1998 |
| EP | 0838858 A2 | 4/1998 |
| EP | 0844651 A1 | 5/1998 |
| EP | 1020900 A2 | 7/2000 |
| EP | 1174928 A1 | 1/2002 |
| JP | 63122176 | 5/1988 |
| JP | 4307974 | 10/1992 |
| JP | 7-106446 | 4/1995 |
| JP | 7106446 | 4/1995 |
| JP | 9-219524 | 8/1997 |
| JP | 9219524 | 8/1997 |
| JP | 9-321307 | 12/1997 |
| JP | 11233744 | 8/1999 |
| JP | 200021783 | 1/2000 |
| JP | 2001160594 | 6/2001 |
| JP | 2001168342 | 6/2001 |
| JP | 2001319935 | 11/2001 |
| JP | 2002-76334 | 3/2002 |
| JP | 02241195 | 8/2002 |
| JP | 2002-359188 | 12/2002 |

| | | |
|---|---|---|
| JP | 2003-23160 | 1/2003 |
| WO | WO-98/59365 | 12/1998 |
| WO | WO-99/53539 | 11/1999 |
| WO | WO-00/54338 | 9/2000 |
| WO | WO-01/54202 A1 | 7/2001 |
| WO | WO-01/93338 A1 | 12/2001 |
| WO | WO-01/99169 A2 | 12/2001 |
| WO | WO-02/13262 A2 | 2/2002 |
| WO | WO-02/15244 A2 | 2/2002 |
| WO | WO-02/47168 A2 | 6/2002 |
| WO | WO-02/071488 A1 | 9/2002 |
| WO | WO-02/071491 A1 | 9/2002 |
| WO | WO-02/071495 A1 | 9/2002 |

OTHER PUBLICATIONS

Ghandhi, VLSI Fabrication Principles Silicon and Gallium Arsenide, 2nd Ed., John Wiley & Sons, Inc., New York, pp. 258-261, 518-522 (1994).

Kim, "Atomic layer deposition of metal and nitride thin films: Current research efforts and applications for semiconductor device processing," J. Vac. Sci. Technol. B, 21(6):2231-2261 (2003).

Liu et al., "Novel Sidewall Strained-Si Channel nMOSFET," IEDM (1999), pp. 63-66.

Meyerson, "UHV/CVD Growth of Si and Si:Ge Alloys: Chemistry, Physics, and Device Applications," Proceedings of the IEEE, 80(10):1592-1608 (1992).

Wolf et al., "Silicon Processing for the VLSI Era, vol. 1: Process Technology," (1986) pp. 201.

Official Action in Japanese Patent Application No. 2003-519978, 3 pages (No translation).

Examination Report in European Patent Application No. 02734816.8, mailed Jan. 24, 2008, 6 pages.

"2 Bit/Cell EEPROM Cell Using Band-to-Band Tunneling for Data Read-Out," IBM Technical Disclosure Bulletin, vol. 35, No. 4B, pp. 136-140 (1992).

Aigouy et al., "MOVPE Growth and optical characterization and optical characterization of ZnSe/ZnS strained layer superlattices," Superlattices and Microstructures, vol. 16, No. 1 (1994) pp. 71-76.

Anonymous, "Germanium P-Channel Mosfet," IBM Technical Disclosure Bulletin, vol. 28, No. 2, Jul. 1, 1985, p. 500.

Armstrong et al., "Design of Si/SiGe Heterojunction Complementary Metal-Oxide-Semiconductor Transistors," IEDM Technical Digest (1995) pp. 761-764.

Armstrong, "Technology for SiGe Heterostructure-Based CMOS Devices," Submitted to the Massachusetts Institute of Technology Department of Electrical Engineering and Computer Science on Jun. 30, 1999, pp. 1-154.

Barradas et al., "RBS analysis of MBE-grown Si/Ge/(001) Si heterostructures with thin, high Ge content SiGe channels for HMOS transistors," Modern Physics Letters B (2001) (abstract).

Bouillon et al., "Search for the optimal channel architecture for 0.18/0.12 µm bulk CMOS Experimental study," IEEE (1996) pp. 21.2.1-21.2.4.

Bufler et al., "Hole transport in strained $Si_{1-x}Ge_x$ alloys on $Si_{1-y}Ge_y$ substrates," Journal of Applied Physics, vol. 84, No. 10 (Nov. 15, 1998) pp. 5597-5602.

Canaperi et al., "Preparation of a relaxed Si-Ge layer on an insulator in fabricating high-speed semiconductor devices with strained epitaxial films," Intern. Business Machinese Corporation, USA (2002) (abstract).

Carlin et al., "High Efficiency GaAs on-Si Solar Cells with High $V_{oc}$ Using Graded GeSi Buffers," IEEE (2000) pp. 1006-1011.

Cheng et al., "Electron Mobility Enhancement in Strained-Si n-MOSFETs Fabricated on SiGe-on-Insulator (SGOI) Substrates," IEEE Electron Device Letters, vol. 22, No. 7 (Jul. 2001) pp. 321-323.

Cheng et al., "Relaxed Silicon-Germanium on Insulator Substrate by Layer Transfer," Journal of Electronic Materials, vol. 30, No. 12, 2001, pp. L37-L39.

Cullis et al., "Growth ripples upon strained SiGe epitaxial layers on Si and misfit dislocation interactions," Journal of Vacuum Science and Technology A, vol. 12, No. 4 (Jul./Aug. 1994) pp. 1924-1931.

Cullis et al., "The characteristics of strain-modulated surface undulations formed upon epitaxial $Si_{1-x}Ge_x$ alloy layers on Si," Journal of Crystal Growth, vol. 123 (1992) pp. 333-343.

Currie et al., "Carrier mobilities and process stability of strained S in- and p-MOSFETs on SiGe virtual substrates," J. Vac. Sci. Technol. B., vol. 19, No. 6 (Nov./Dec. 2001) pp. 2268-2279.

Currie et al., "Controlling threading dislocation densities in Ge on Si using graded SiGe layers and chemical-mechanical polishing," Applied Physics Letters, vol. 72, No. 14 (Apr. 6, 1998) pp. 1718-1720.

Eaglesham et al., "Dislocation-Free Stranski-Krastanow Growth of Ge on Si(100)," Physical Review Letters, vol. 64, No. 16 (Apr. 16, 1990) pp. 1943-1946.

Fischetti et al., "Band structure, deformation potentials, and carrier mobility in strained Si, Ge, and SiGe alloys," J. Appl. Phys., vol. 80, No. 4 (Aug. 15, 1996) pp. 2234-2252.

Fischetti, "Long-range Coulomb interactions in small Si devices. Part II. Effective electronmobility in thin-oxide structures," Journal of Applied Physics, vol. 89, No. 2 (Jan. 15, 2001) pp. 1232-1250.

Fitzgerald et al., "Dislocation dynamics in relaxed graded composition semiconductors," Materials Science and Engineering B67, (1999) pp. 53-61.

Fitzgerald et al., "Relaxed $Ge_xSi_{1-x}$ structures for III-V integration with Si and high mobility two-dimensional electron gases in Si," J. Vac. Sci. Technol. B, vol. 10 No. 4 (Jul./Aug. 1992) pp. 1807-1819.

Fitzgerald et al., "Totally relaxed $Ge_xSi_{1-x}$ layers with low threading dislocation densities grown on Si substrates," Appl. Phys. Lett., vol. 59, No. 7 (Aug. 12, 1991) pp. 811-813.

Gannavaram et al., "Low Temperature ($\leq 800°$ C.) Recessed Junction Selective Silicon-Germanium Source/Drain Technology for sub-70 nm CMOS," 2000 IEEE IEDM Tech. Dig., pp. 437-440.

Garone et al., "Silicon vapor phase epitaxial growth catalysis by the presence of germane," Applied Physics Letters, vol. 56, No. 13 (Mar. 26, 1990) pp. 1275-1277.

Ge et al., "Process-Strained Si (PSS) CMOS Technology Featuring 3D Strain Engineering," 2003 IEEE IEDM Tech. Dig., pp. 73-76.

Ghani et al., "A 90nm High Volume Manufacturing Logic Technology Featuring Novel 45nm Gate Length Strained Silicon CMOS Transistors," 2003 IEEE IEDM Tech. Dig., 978-980.

Grützmacher et al., "Ge segregation in SiGe/Si heterostructures and its dependence on deposition technique and growth atmosphere," 63 Applied Physics Letters 18, pp. 2531-2533 (1993).

Hackbarth et al., "Alternatives to thick MBE-grown relaxed SiGe buffers," Thin Solid Films, vol. 369, No. 1-2 (2000) pp. 148-151.

Hackbarth et al., "Strain relieved SiGe buffers for Si-based heterostructure field-effect transistors," Journal of Crystal Growth, vol. 201 (1999) pp. 734-738.

Hamada et al., "A New Aspect of Mechanical Stress Effects in Scaled MOS Devices," 38 IEEE Trans. on Electron Devices 4, pp. 895-900 (1991).

Herzog et al., "SiGe-based FETs: buffer issues and device results," Thin Solid Films, vol. 380 (2000) pp. 36-41.

Hock et al., "Carrier mobilities in modulation doped $Si_{1-x}Ge_x$ heterostructures with respect to FET applications," Thin Solid Films, vol. 336 (1998) pp. 141-144.

Hock et al., "High hole mobility in $Si_{0.17}Ge_{0.83}$ channel metal-oxide-semiconductor field-effect transistors grown by plasma-enhanced chemical vapor deposition," Applied Physics Letters, vol. 76, No. 26, Jun. 26, 2000, pp. 3920-3922.

Hock et al., "High performance 0.25 µm p-type Ge/SiGe MODFETs," Electronics Letters, vol. 34, No. 19 (Sep. 17, 1998) pp. 1888-1889.

Huang et al., "Isolation Process Dependence of Channel Mobility in Thin-Film SOI Devices," 17 IEEE Electron Device Letters 6, pp. 291-293 (1996).

Huang et al., "LOCOS-Induced Stress Effects on Thin-Film SOI Devices," 44 IEEE Trans. on Electron Devices 4, pp. 646-650 (1997).

Huang, et al., "Reduction of Source/Drain Series Resistance and Its Impact on Device Performance for PMOS Transistors with Raised $Si1-xGex$ Source/Drain," 21 IEEE Electron Device Letters 9, pp. 448-450 (2000).

Iida et al., "Thermal behavior of residual strain in silicon-on-insulator bonded wafer and effects on electron mobility," Solid-State Electronics, vol. 43, pp. 1117-1120 (1999).

International Search Report for International Patent Application No. PCT/US02/19384, dated Sep. 10, 2002, 5 pages.

International Search Report for PCT/US02/19607, dated Oct. 10, 2002.

International Search Report for PCT/US03/17275, dated Oct. 14, 2003.

International Search Report for PCT/US03/18123, dated Dec. 1, 2003.

Ismail et al., "Modulation -doped n-type Si/SiGe with inverted interface," Appl. Phys. Lett., vol. 65, No. 10 (Sep. 5, 1994) pp. 1248-1250.

Ito et al., "Mechanical Stress Effect on Etch-Stop Nitride and its Impact on Deep Submicron Transistor Design," 2000 IEEE IEDM Tech. Dig., pp. 247-250 (2000).

Kearney et al., "The effect of alloy scattering on the mobility of holes in a $Si_{1-x}Ge_x$ quantum well," Semicond. Sci. Technol., vol. 13 (1998) pp. 174-180.

Kikkawa et al., "Effect of strained InGaAs step bunching on mobility and device performance in n-InGaP/InGaAs/GaAs pseudomorphic heterostructures grown by metalorganic vapor phase epitaxy," Journal of Crystal Growth, vol. 145 (1994) pp. 799-807.

Koester et al., "Extremely High Transconductance $Ge/Si_{0.4}Ge_{0.6}$ p-MODFET's Grown by UHV-CVD," IEEE Electron Device Letters, vol. 21, No. 3 (Mar. 2000) pp. 110-112.

Konig et al., "Design Rules for n- Type SiGe Hetero FETs," Solid State Electronics, vol. 41, No. 10 (1997), pp. 1541-1547.

Konig et al., "p-Type Ge-Channel MODFET's with High Transconductance Grown on Si Substrates," IEEE Electron Device Letters, vol. 14, No. 4 (Apr. 1993) pp. 205-207.

Konig et al., "SiGe HBTs and HFETs," Solid-State Electronics, vol. 38, No. 9 (1995) pp. 1595-1602.

Lee et al., "Strained Ge channel p-type MOSFETs fabricated on $Si_{1-x}Ge_x$/Si virtual substrates," Mat. Res. Soc. Symp. Proc., vol. 686, 2002, pp. A1.9.1-A1.9.5.

Lee et al., "Strained Ge Channel p-type Metal-Oxide-Semiconductor Field-Effect Transistors Grown on Si1-xGex/Si Virtual Substrates", Applied Physics Letters, vol. 79, No. 20, Nov. 12, 2001, pp. 3344-3346.

Leitz et al., "Channel Engineering of SiGe-Based Heterostructures for High Mobility MOSFETs," Mat. Res. Soc. Symp. Proc., vol. 686, 2002, pp. A3.10.1-A3.10.6.

Leitz et al., "Dislocation glide and blocking kinetics in compositionally graded SiGe/Si," Journal of Applied Physics, vol. 90, No. 6 (Sep. 15, 2001) pp. 2730-2736.

Leitz et al., "Hole mobility enhancements in strained $Si/Si_{1-y}Ge_y$ p-type metal-oxide-semiconductor field-effect transistors grown on relaxed $Si_{1-x}Ge_x$ (x<y) virtual substrates," Applied Physics Letters, vol. 79, No. 25, Dec. 17, 2001, pp. 4246-4248.

Li et al., "Design of high speed Si/SiGe heterojunction complementary metal-oxide-semiconductor field effect transistors with reduced short-channel effects," J. Vac. Sci. Technol., A 20(3), May/Jun. 2002, pp. 1030-1033.

Lochtefeld et al., "Investigating the Relationship Between Electron Mobility and Velocity in Deeply Scaled NMOS via Mechanical Stress," 22 IEEE Electron Device Letters 12, pp. 591-593 (2001).

Maiti et al., "Strained-Si heterostructure field effect transistors," Semicond. Sci. Technol., vol. 13 (1998) pp. 1225-1246.

Meyerson et al., "Cooperative Growth Phenomena in Silicon/Germanium Low-Temperature Epitaxy," Applied Physics Letters, vol. 53, No. 25 (Dec. 19, 1988) pp. 2555-2557.

Mizuno et al., "Advanced SOI-MOSFETs with Strained-Si Channel for High Speed CMOS Electron/Hole Mobility Enhancement," 2000 Symposium on VLSI Digest of Technology Papers (Jun. 13, 2000) pp. 210-211.

Rim et al., "Enchanced Hole Mobilities in Surface-Channel Strained-Si p-MOSFETs," Solid State Electronics Laboratory, Stanford University, Stanford, CA 94305, pp. 20.3.1-20.3.4.

Ueno et al., "Low Temperature Buffer Growth for Modulation Doped SiGe/Ge/SiGe Heterostructures with High Hole Mobility", Thin Solid Films, vol. 369, 2000, pp. 320-323.

Usami et al., "Spectroscopic study of Si-based quantum wells with neighboring confinement structure," Semicon. Sci. Technol. (1997) (abstract).

Welser et al., "Evidence of Real-Space Hot-Electron Transfer in High Mobility, Strained-Si Multilayer MOSFETs," Electron Devices meetings, 1993. Technical Digest (Dec. 1993) pp. 21.3.1-21.3.4.

Welser, "The Application of Strained Silicon/Relaxed Silicon Germanium Heterostructures to Metal-Oxide-Semiconductor Field-Effect Transistors," Ph.D. Thesis, Stanford University (1995) pp. 1-205.

Wesler et al., "Electron Mobility Enhancement in Strained-Si N-Type Metal-Oxide-Semiconductor Field-Effect Transistors," IEEE Electron Device Letters, vol. 15, No. 3 (Mar. 1994) pp. 100-102.

Wesler et al., "NMOS and PMOS Transistors Fabricated in Strained Silicon/Relaxed Silicon-Germanium Structures," Electron Devices Meeting, 1992. Technical Digest (Dec. 13, 1992) pp. 31.7.1-31.7.3.

Xie et al., "Semiconductor Surface Roughness: Dependence on Sign and Magnitude of Bulk Strain," The Physical Review Letters, vol. 73, No. 22 (Nov. 28, 1994) pp. 3006-3009.

Xie et al., "Very high mobility two-dimensional hole gas in $Si/Ge_xSi_{1-x}/Ge$ structures grown by molecular beam epitaxy," Appl. Phys. Lett., vol. 63, No. 16 (Oct. 18, 1993) pp. 2263-2264.

Xie, "SiGe Field effect transistors," Materials Science and Engineering, vol. 25 (1999) pp. 89-121.

Yeo et al., "Enhanced Performance in Sub-100 nm CMOSFETs Using Strained Epitaxial Silicon-Germanium" IEEE, Proceedings of IEDM Conference 2000, Piscataway, New Jersey, (Dec. 10, 2000) pp. 753-756.

Yousif et al., Recent Critical Issues in $Si/Si_{1-x}Ge_x/Si$ Heterostructure FET Devices, Solid-State Electronics, vol. 45, No. 11, Nov. 2001, pp. 1931-1937.

Öztürk et al., "Advanced Si1-xGex Source/Drain and Contact Technologies for Sub-70 nm CMOS," 2002 IEEE IEDM Tech. Dig., pp. 375-378.

Öztürk et al., "Low Resistivity Nickel Germanosilicide Contacts to Ultra-Shallow Si1-xGex Source/Drain Junctions for Nanoscale CMOS," 2003 IEEE IEDM Tech. Dig., pp. 497-500.

Öztürk et al., "Selective Silicon-Gremanium Source/Drain Technology for Nanoscale CMOS," Mat. Res. Soc. Symp. Proc., vol. 717, pp. C4.1.1-C4.1.1(2002).

Öztürk et al., "Ultra-Shallow Source/Drain Junctions for Nanoscale CMOS Using Selective Silicon-Germanium Technology," Extended Abstracts of Int'l Workshop on Junction Tech., pp. 77-82 (2001).

Grutzmacher et al., "Ge segregation in SiGe/Si heterostructures and its dependence on deposition technique and growth atmosphere," Applied Physics Letters, vol. 63, No. 18 (Nov. 1, 1993) pp. 2531-2533.

Hackbarth et al., "Alternatives to thick MBE-grown relaxed SiGe buffers," Thin Solid Films, vol. 369, No. 1-2 (2000) pp. 148-151.

Kearney et al., "The effect of alloy scattering on the mobility of holes in a Si1-xGex quantum well," Semicond. Sci. Tech., vol. 13, pp. 174-180 (1998).

Koester et al., "Extremely High Transconductance Ge/Si0.4Ge0.6 p-MODFET's Grown by UHV-CVD," 21 IEEE Electron Device Letters 3, pp. 110-112 (2000).

Lee et al., "Strained Ge channel p—type MOSFETs fabricated on $Si_{1-x}Ge_x$/Si virtual substrates," Mat. Res. Soc. Symp. Proc., vol. 686, 2002, pp. A1.9.1-A1.9.5.

Leitz et al., "Hole mobility enhancements in strained $Si/Si_{1-y}Ge_y$ p—type metal-oxide-semiconductor field-effect transistors grown on relaxed $Si_{1-x}Ge_x$ (x<y) virtual substrates," Applied Physics Letters, vol. 79, No. 25, Dec. 17, 2001, pp. 4246-4248.

Maiti et al., "Strained-Si heterostructure field effect transistors," Semicond. Sci. Tech., vol. 13, pp. 1225-1246 (1998).

Mizuno et al., "Electron and Hole Mobility Enhancement in Strained-Si MOSFET's on SiGe-on-Insulator Substrates Fabricated by SIMOX Technology," 21 IEEE Electron Device Letters 5, pp. 230-232 (2000).

Mizuno et al., "Electron and Hole Mobility Enhancement in Strained-Si MOSFET's on SiGe-on-Insulator Substrates Fabricated by SIMOX Technology," IEEE Electron Device Letters, col. 21, No. 5 (May 2000) pp. 230-232.

Nayak et al., "High Mobility Strained-Si PMOSFET's," *IEEE Transactions on Electron Devices*, vol. 43, No. 10 (Oct. 1996) pp. 1709-1716.

O'Neill et al., "SiGe Virtual substrate N-channel heterojunction MOSFETS," *Semicond. Sci. Technol.*, vol. 14 (1999) pp. 784-789.

Ootsuka et al., "A Highly Dense, High-Performance 130nm node CMOS Technology for Large Scale System-on-a-Chip Applications," 2000 IEEE IEDM Tech. Dig., pp. 575-578 (2000).

Ota et al., "Novel Locally Strained Channel Technique for High Performance 55nm CMOS," 2002 IEEE IEDM Tech. Dig., pp. 27-30.

Parker et al., "SiGe heterostructure CMOS circuits and applications," *Solid State Electronics*, vol. 43, No. 8, (Aug. 1999) pp. 1497-1506.

Pelekanos et al., "Interface roughness correlation in CdTe/CdZnTe strained quantum wells," *Journal of Crystal Growth*, vol. 184/185 (1998) pp. 886-889.

Ransom et al., "Gate-Self-Aligned n-channel and p-channel Germanium MOSFET's," *IEEE Transactions on Electron Devices*, vol. 38, No. 12 (Dec. 1991) pp. 2695.

Reinking et al., "Fabrication of High-Mobility Ge p-Channel MOSFETs on Si Substrates," Electronics Letters, vol. 35, No. 6, Mar. 18, 1999, pp. 503-504.

Rim et al., "Fabrication and Analysis of Deep Submicron Strained-Si N-MOSFET's," *IEEE Transactions on Electron Devices*, vol. 47, No. 7 (Jul. 2000) pp. 1406-1415.

Rim, "Application of Silicon Based Heterostructures to Enhanced Mobility Metal-Oxide-Semiconductor Field-Effect Transistors," Ph.D. Thesis, Stanford University (1999) pp. 1-184.

Robbins et al., "A model for heterogeneous growth of $Si_{1-x}Ge_x$ films for hydrides," *Journal of Applied Physics*, vol. 69, No. 6 (Mar. 15, 1991) pp. 3729-3732.

Rosenblad et al., "Virtual Substrates for the n- and p-type Si-MODFET Grown at Very High Rates", Materials Science and Engineering, B vol. 74, 2000, pp. 113-117.

Sadek et al., "Design of Si/SiGe Heterojunction Complementary Metal-Oxide-Semiconductor Transistors," *IEEE Transactions on Electron Devices*, vol. 43, No. 8 (Aug. 1996) pp. 1224-1232.

Schaffler, "High-mobility Si and Ge structures," *Semicond. Sci. Technol.*, vol. 12 (1997) pp. 1515-1549.

Shimizu et al., "Local Mechanical-Stress Control (LMC): A New Technique for CMOS-Performance Enhancement," 2001 IEEE IEDM Tech. Dig., pp. 433-436.

Srolovitz, "On the Stability of Surfaces of Stressed Solids," Acta metall., vol. 37, No. 2 (1989) pp. 621-625.

Thompson et al., "A 90 nm Logic Technology Featuring 50nm Strained-Silicon Channel Transistors, 7 layers of Cu Interconnects, Low k ILD, and 1um2 SRAM Cell," 2002 IEEE IEDM Tech. Dig., pp. 61-64.

Thompson et al., "A Logic Nanotechnology Featuring Strained-Silicon," 25 IEEE Electron Device Letters 4, pp. 191-193 (2004).

Tiwari et al., "Hole Mobility Improvement in Silicon-on-Insulator and Bulk Silicon Transistors Using Local Strain," 1997 IEEE IEDM Tech. Dig., pp. 939-941.

Tweet et al., "Factors determining the composition of strained GeSi layers grown with disilane and germane," *Applied Physics Letters*, vol. 65, No. 20 (Nov. 14, 1994) pp. 2579-2581.

Uchino, et al., "A Raised Source/Drain Technology Using In-situ P-doped SiGe and B-doped Si for 0.1-μm CMOS ULSIs," 1997 IEEE IEDM Tech. Dig., pp. 479-482.

Rim et al., "Enchanced Hole Mobilities in Surface-Channel Strained-Si *p*-MOSFETs," Solid State Electronics Laboratory, 1995, Stanford University, Stanford, CA 94305, pp. 20.3.1-20.3.4.

\* cited by examiner

US 8,436,336 B2

STRUCTURE AND METHOD FOR A HIGH-SPEED SEMICONDUCTOR DEVICE HAVING A GE CHANNEL LAYER

GOVERNMENT SUPPORT

This invention was made with government support under Contract No. F19628-99-C-0043, awarded by the Air Force. The government has certain rights in the invention.

PRIORITY INFORMATION

This application claims the benefit of and priority to U.S. patent application Ser. No. 10/173,986, filed Jun. 18, 2002 now U.S. Pat. No. 7,301,180, which claims priority to U.S. Provisional Patent Application Ser. No. 60/299,139, filed Jun. 18, 2001; the entire disclosure of each application is hereby incorporated by reference.

BACKGROUND OF THE INVENTION

The invention relates to the field of MOSFET fabrication, and in particular to the formation of Ge channel MOSFETs grown on SiGe/Si virtual substrates.

Channel engineering in the silicon-germanium (SiGe) materials system can result in increased electron and hole mobilities over conventional bulk Si, leading to enhanced metal-oxide-semiconductor field-effect transistor (MOSFET) performance. In particular, increases in mobility ($\mu$) realized through channel engineering lead to increases in MOSFET drain currents and ultimately to higher switching speeds. In addition, the low hole mobility of bulk Si ($\mu_{hole} \sim 0.5 \mu_{electron}$) leads to increased p-MOSFET gate widths to compensate for their reduced drive currents. The increased chip area taken up by p-MOSFETs wastes valuable real estate, while the mismatch in n- and p-MOSFET areas further reduces logic speed through capacitive delays; both of which force circuit designers to avoid p-MOSFETs in logic circuits whenever possible. High mobility layers, while critical in n-MOSFETs, thus offer particularly important improvements for p-MOSFET design.

Compressively strained SiGe layers, deposited on bulk Si and capped with bulk Si to preserve the Si/SiO$_2$ gate interface, lead to modest increases in hole mobility, though electron mobility is unchanged. Increased process complexity and degraded short channel effects further moderate gains in circuit performance through this channel architecture. Tensile strained Si layers grown on relaxed SiGe virtual substrates offer large gains in electron and hole mobility, but the ratio of electron to hole mobility remains unbalanced. Schottky-gated modulation-doped field-effect transistors (MODFETs) incorporating buried compressively strained Ge channels on relaxed Si$_{1-x}$Ge$_x$(x>0.6) virtual substrates provide high hole mobility, but their limited voltage swing, high standby power consumption, and process complexity preclude their use in digital or large-scale integrated circuits. The combination of buried compressively strained Si$_{1-y}$Ge$_y$ channels and tensile strained Si surface channels on relaxed Si$_{1-x}$Ge$_x$ virtual substrates (y>x), hereafter referred to as dual channel heterostructures, provide high hole mobility in a complementary MOSFET (CMOS)-compatible layer structure. Peak effective hole mobilities of 760 cm$^2$/V-s have been reported for a dual channel heterostructure p-MOSFET with a strained Si$_{0.17}$Ge$_{0.83}$ channel on a relaxed Si$_{0.48}$Ge$_{0.52}$ virtual substrate.

Pure Ge has the highest hole mobility of all semiconductors, along with an electron mobility comparable to bulk Si. MOSFETs based on pure Ge channels thus offer large performance gains over bulk Si. Effective mobilities as high as 1000 cm$^2$/V-s have been reported for n- and p-MOSFETs fabricated on bulk Ge and utilizing germanium oxynitride as a gate material. However, bulk Ge substrates are not an economical manufacturing technology for integrated circuits. Also, an effective hole mobility of 430 cm$^2$/V-s has been attained for relaxed Ge deposited directly onto a (111) Si substrate with no buffers and utilizing a SiO$_2$ gate. However, neither of these device structures provides the consistent control of defect density (imparted by SiGe virtual substrate technology) or well-developed gate interface (as, for example, in Si/SiO$_2$) required for large-scale integrated applications.

SUMMARY OF THE INVENTION

The invention provides semiconductor structure comprising a strained Ge channel layer, and a gate dielectric disposed over the strained Ge channel layer. In one aspect of the invention, a strained Ge channel MOSFET is provided. The strained Ge channel MOSFET includes a relaxed SiGe virtual substrate with a Ge content between 50-95%, and a strained Ge channel formed on the virtual substrate. A gate structure is formed upon the strained Ge channel, whereupon a MOSFET is formed with increased performance over bulk Si. In another embodiment of the invention, a semiconductor structure comprising a relaxed Ge channel layer and a virtual substrate, wherein the relaxed Ge channel layer is disposed above the virtual substrate. In a further aspect of the invention, a relaxed Ge channel MOSFET is provided. The method includes providing a relaxed virtual substrate with a Ge composition of approximately 100% and a relaxed Ge channel formed on the virtual substrate.

DETAILED DESCRIPTION OF THE INVENTION

Figure 1:
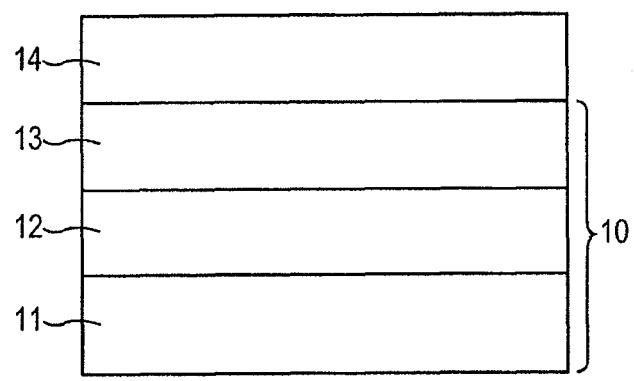
FIG. 1 is a cross-section schematic of a strained Ge channel layer structure used in accordance with the invention.

FIG. 1 is a schematic of the layer structure upon which strained Ge channel MOSFETs are created. The layer structure includes a high quality strained Ge channel layer 14 provided on a virtual substrate 10. This strained Ge channel layer 14 may be provided on virtual substrate 10 either through epitaxial deposition or through wafer bonding techniques. In the exemplary embodiment shown in FIG. 1, the virtual substrate 10 includes a Si substrate 11, a graded composition SiGe layer 12, and a relaxed SiGe cap layer 13. The graded composition SiGe layer 12 is graded from approximately 0% Ge to a final concentration between 50% Ge and 95% Ge at a grading rate, for example, of 10% Ge/micron for a final thickness of approximately 5.0-9.5 microns. A method for providing high quality graded buffer layers is disclosed in U.S. Pat. No. 6,107,653 by Fitzgerald et al. The relaxed SiGe cap layer 13 contains 50% Ge to 95% Ge, for example, and has a thickness of 0.2-2.0 microns. A strained Ge channel layer 14 is provided on the virtual substrate 10. The strained Ge channel layer 14 has a thickness of 50 Å-500 Å and is compressively strained. The strained Ge channel layer 14 may grown at reduced temperature ($T_{growth}$<550° C.) to suppress strain-induced surface undulations and improve surface morphology, forming a strained Ge channel layer that is substantially planar. This planarity improves carrier mobility and facilitates device fabrication. The strained Ge channel layer 14 provides enhanced mobility and performance when it is used to create MOSFETs, while the virtual substrate 10 provides the necessary defect control and large area substrates for integrated circuit manufacturing. In a preferred embodiment, the strained Ge channel layer 14 is fabricated on the virtual substrate 10, which includes a relaxed SiGe cap layer 13 that is 70% Ge.

Figure 2:
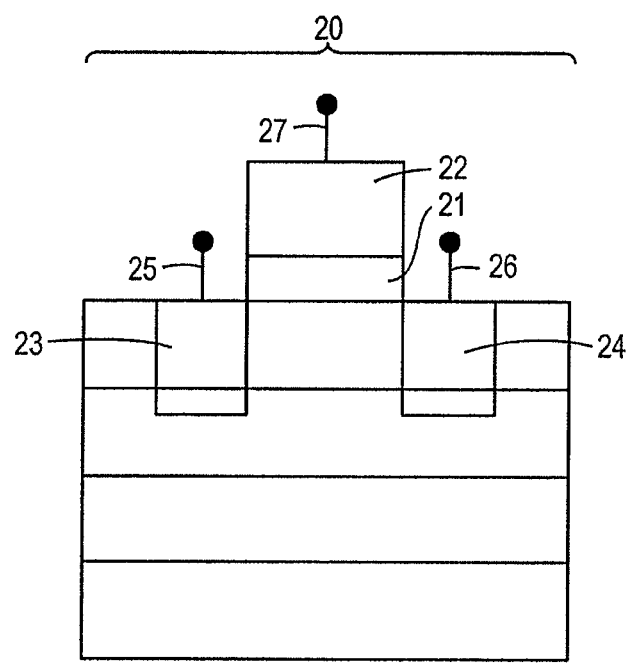
FIG. 2 is a cross-section schematic of a strained Ge MOSFET in accordance with the invention.

FIG. 2 is a cross-section of a schematic diagram of a strained Ge channel MOSFET 20 in accordance with the invention. The MOSFET 20 includes virtual substrate 10 and a strained Ge channel layer 14. A gate dielectric layer 21 is formed upon the strained Ge channel layer 14. The gate dielectric may be, for example, a dielectric comprising $SiO_2$ or a deposited dielectric, and possesses satisfactory integrity required for MOSFETs in operation within integrated circuits. For purposes hereof, a gate dielectric with satisfactory integrity is one that has, for example, a relatively low interface state density, e.g., less than $1 \times 10^{11}$ $eV^{-1}$ $cm^{-2}$, and/or a relatively low leakage current, e.g., <10 nanoamperes/square micrometer ($nA/\mu m^2$) to 1 microampere/square micron ($\mu A/\mu m^2$) or even 10 $\mu A/\mu m^2$, preferably approximately 10-100 $nA/\mu^2$ at 100° C. In some preferred embodiments, the leakage current may range from approximately 10-100 $nA/\mu m^2$. The gate dielectric thickness may be, for example 15 Å. A gate contact 22, such as doped polysilicon, is deposited on the gate dielectric layer 21. The layers are patterned by photolithography and etching. The MOSFET 20 also includes a source 23 and drain 24. The source and drain regions are defined by ion implantation. The dopant species in the source and drain is n-type or p-type for either n-MOSFET or p-MOSFET operation, respectively. By utilizing the strained Ge channel layer 14, high mobility MOSFET operation is achieved. The MOSFET 20 also includes three terminals 25, 26, and 27. The terminals 25 and 26 are used to establish electrical voltages between the source 23 and drain 24 while the terminal 27 is used to modulate the conductivity of the strained Ge channel 14 under the gate dielectric 21.

Figure 3:
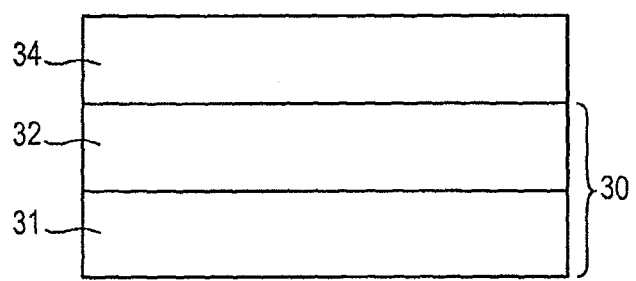
FIG. 3 is a cross-section schematic of a relaxed Ge channel layer structure used in accordance with the invention.

FIG. 3 is a schematic of the layer structure upon which relaxed Ge channel MOSFETs are created. The layer structure includes a high quality relaxed Ge layer 34 provided on a virtual substrate 30. This relaxed Ge layer 34 may be provided on the virtual substrate 30 either through epitaxial deposition or through wafer bonding techniques. In the exemplary embodiment shown in FIG. 3, the virtual substrate includes a Si substrate 31 and a graded composition SiGe layer 32. The graded composition layer 32 is graded to a final Ge percentage of approximately 100% at a grading rate, for example, of 10% Ge/micron for a final thickness of approximately 10 microns. The relaxed Ge channel layer 34 may have a thickness of 50 Å-2 microns.

Figure 4:
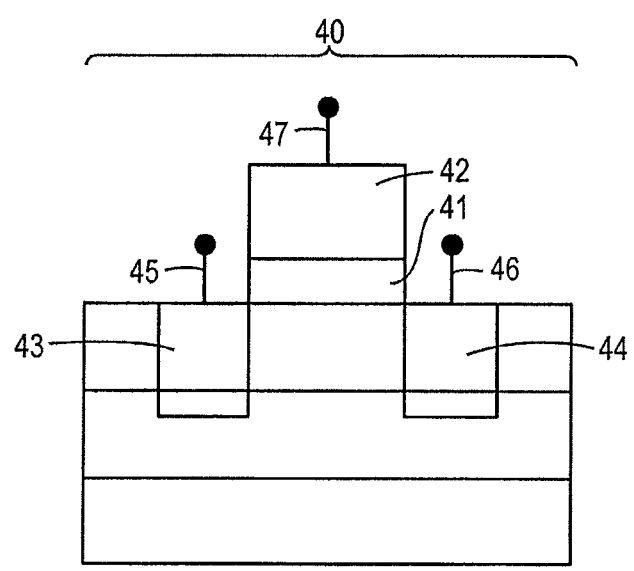
FIG. 4 is a cross-section schematic of a relaxed Ge MOSFET in accordance with the invention.

FIG. 4 is a cross-section of a schematic diagram of a relaxed Ge channel MOSFET 40 in accordance with the invention. The MOSFET 40 includes a virtual substrate 30 and a relaxed Ge channel layer 34. A gate dielectric layer 41 is formed upon the relaxed Ge channel 34. The gate dielectric may be, for example, a dielectric comprising $SiO_2$ or a deposited dielectric, and possesses satisfactory integrity required for MOSFETs in operation within integrated circuits. The gate dielectric thickness may be, for example 15 Å. A gate contact 42, such as doped polysilicon, is deposited on the gate dielectric layer 41. The layers are patterned by photolithography and etching. The MOSFET 40 also includes a source 43 and drain 44. The source and drain regions are defined by ion implantation. The dopant species in the source and drain is n-type or p-type for either n-MOSFET or p-MOSFET operation, respectively. By utilizing the relaxed Ge channel layer 34, high mobility MOSFET operation is achieved. The MOSFET 40 also includes three terminals 45, 46, and 47. The terminals 45 and 46 are used to establish electrical voltages between the source 43 and drain 44 while the terminal 47 is used to modulate the conductivity of the relaxed Ge channel 34 under the gate dielectric 41.

Figure 5:
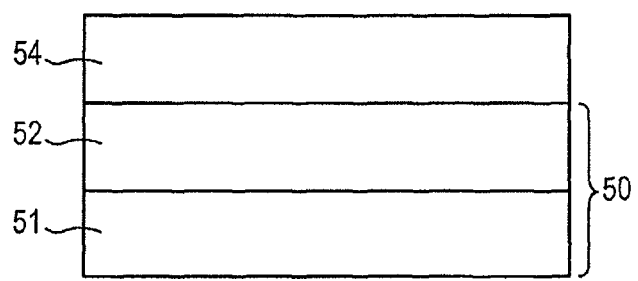
FIG. 5 is a cross-section schematic of a strained or relaxed Ge channel structure on a virtual substrate comprising an insulating layer.

In an alternative embodiment shown in FIG. 5, the virtual substrate 50 may comprise a Si substrate and an insulating layer 52 on which the strained or relaxed Ge channel 54 is provided via wafer bonding. In the strained Ge channel case, an optional relaxed SiGe layer with a Ge concentration between 50% and 95% may also be provided between the insulating layer and the strained Ge channel layer. These structures can be provided through the layer transfer techniques disclosed in U.S. patent application Ser. No. 09/764,182.

Figure 6:
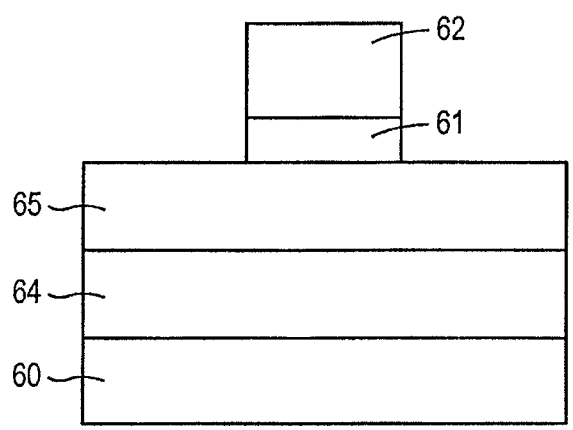
FIG. 6 is a cross-section schematic of a strained or relaxed Ge channel layer structure with a thin Si cap used in accordance with the invention.

In an alternative embodiment shown in FIG. 6, a thin Si layer 65 that may be strained or partially relaxed is provided on either the strained or relaxed Ge channel layer 64. When the Ge channel is strained, the thin Si layer may be grown at reduced temperature ($T_{growth}$<550° C.) initially to improve surface morphology and stabilize the compressively strained Ge channel layer against strain-induced undulations, forming a strained Ge channel layer that is substantially planar. The thin Si layer may then be grown at high temperatures ($T_{growth}$>400° C.) to improve the growth rate in chemical vapor deposition. The thin Si layer 65 may be initially grown upon strained or relaxed Ge channel layer at low temperatures to improve the morphology of this layer and form a thin Si layer that is substantially planar. The thickness of the thin Si layer may be minimized to reduce carrier population in this layer. The strained or relaxed Ge channel layer 64 provides enhanced mobility and performance when it is used to create MOSFETs, while the virtual substrate 60 provides the necessary defect control and large area substrates for integrated circuit manufacturing. The virtual substrate 60 may be the virtual substrates 10, 30 or 50 shown in previous embodiments. As in the embodiment discussed above with reference to FIG. 4, a gate dielectric layer 61 is formed above the Ge channel layer 64. The thin Si layer 65 provides a high quality interface between the semiconductor layer structure and the gate dielectric. A gate contact 62, such as doped polysilicon, is deposited on the gate dielectric layer 61 for modulating the conductivity of the Ge channel layer 64 under the gate dielectric 61.

Figure 7:
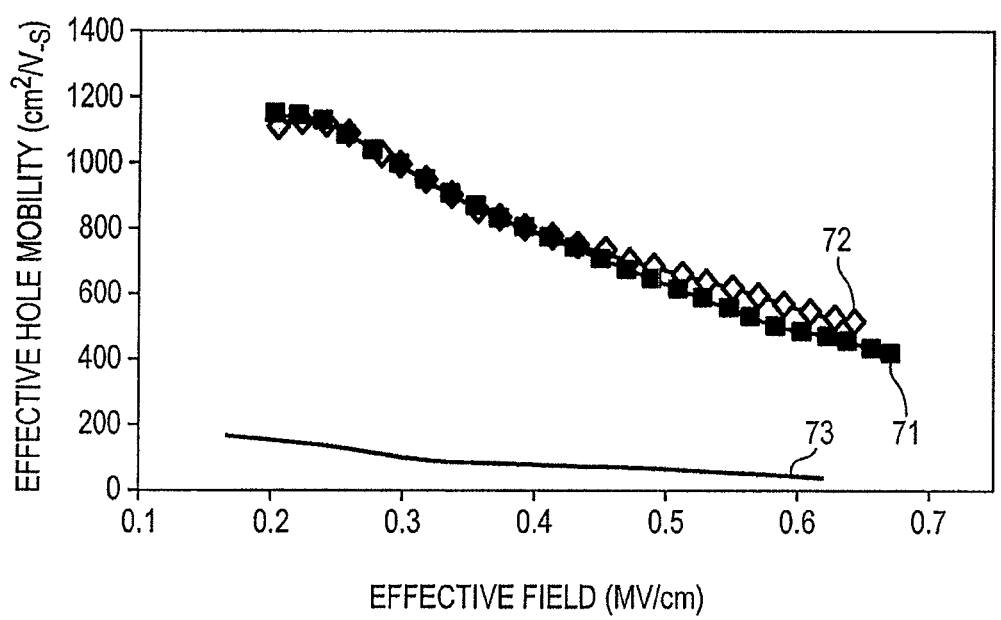
FIG. 7 is a graph that demonstrates the effective hole mobilities of two strained Ge p-MOSFET devices and a bulk silicon control.

FIG. 7 is a graph that demonstrates effective hole mobilities 71, 72, and 73 versus effective vertical field. Effective hole mobility 71 corresponds to a first strained Ge p-MOSFET device with a Si cap thickness of 60 Å, effective hole mobility 72 corresponds to a second strained Ge p-MOSFET device with a Si cap thickness of 50 Å, and effective hole mobility 73 corresponds to a bulk silicon control p-MOSFET. The strained-Ge channel devices exhibit a peak hole mobility of 1160 cm$^2$/V–s.

Figure 8:
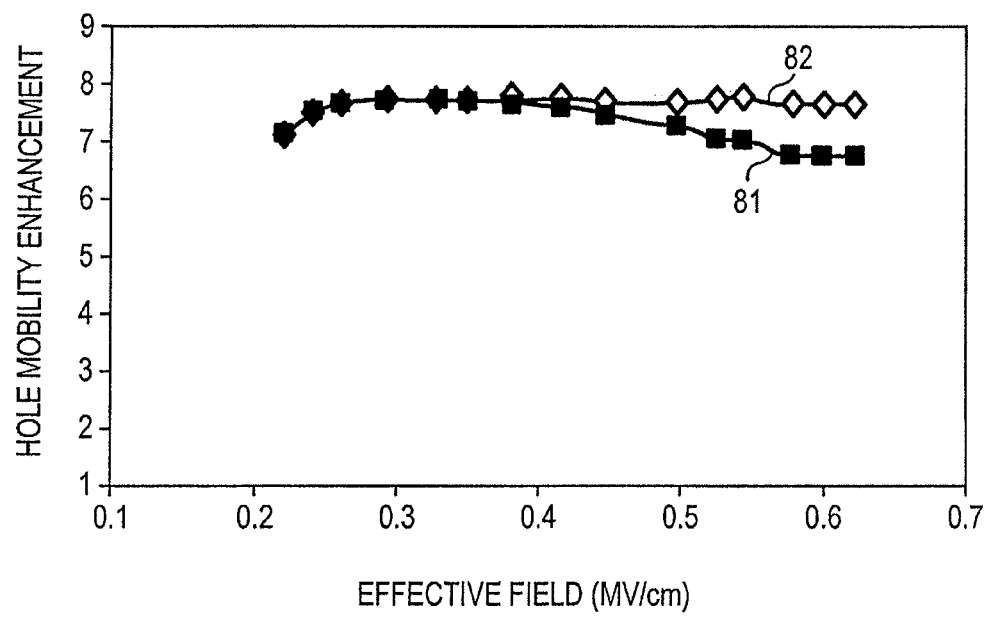
FIG. 8 is a graph that demonstrates the hole mobility enhancement associated with two strained Ge p-MOSFET devices.

FIG. 8 is a graph that demonstrates effective hole mobility enhancements 81 and 82 versus effective vertical field. Effective hole mobility enhancement 81 corresponds to a first strained Ge p-MOSFET device with a Si cap thickness of 60 Å, and effective hole mobility enhancement 82 corresponds to a second strained Ge p-MOSFET device with a Si cap thickness of 50 Å. At high vertical fields, FIG. 8 shows that mobility enhancement 81 is degraded as compared to mobility enhancement 82. This indicates that the holes can be pulled into the Si cap layer 65 where their mobility is not as high as in the Ge channel layer 64. The consistency of the Ge channel hole mobility enhancement 82 over a wide range of vertical electric fields demonstrates that maintaining a sufficiently low Si cap thickness (less than approximately 50 Å) allows the high field mobility enhancement to be completely preserved.

Although the present invention has been shown and described with respect to several preferred embodiments thereof, various changes, omissions and additions to the form and detail thereof, may be made therein, without departing from the spirit and scope of the invention.

What is claimed is:

1. A semiconductor structure comprising:
   a strained Ge channel layer substantially free of undulations;
   a thin Si layer disposed over and in direct contact with the strained Ge channel layer;
   a gate dielectric disposed over and in direct contact with the thin Si layer; and
   a gate contact disposed above the gate dielectric, application of an operating voltage to the gate contact modulating movement of a plurality of charge carriers within the strained Ge channel layer,
   wherein a thickness of the thin Si layer is smaller than a thickness of the strained Ge channel layer and sufficiently small such that a majority of the plurality of charge carriers populate the strained Ge channel layer when the operating voltage is applied to the gate contact, thereby preserving the carrier mobility.

2. The structure of claim 1 further comprising a virtual substrate, wherein the strained Ge channel layer is disposed over the virtual substrate.

3. The structure of claim 2, wherein the virtual substrate comprises a relaxed layer comprising Si and Ge.

4. The structure of claim 3, wherein the relaxed layer includes over 50% Ge.

5. The structure of claim 3, wherein the relaxed layer includes approximately 70% Ge.

6. The structure of claim 2, wherein the virtual substrate comprises an insulating layer, and the strained Ge channel layer is in direct contact with the insulating layer.

7. The structure of claim 1, further comprising:
   a source region disposed in a first portion of the strained Ge channel layer; and
   a drain region disposed in a second portion of the strained Ge channel layer.

8. The structure of claim 7, wherein the source region and the drain region are p-type doped.

9. The structure of claim 7, wherein the source region and the drain region are n-type doped.

10. The structure of claim 1, wherein the thin Si layer is substantially free of surface undulations.

11. The structure of claim 1, wherein the thickness of the thin Si layer is less than approximately 50 Å.

12. The structure of claim 1, wherein the gate dielectric comprises $SiO_2$.

13. The structure of claim 1, wherein a thickness of the strained Ge channel layer is less than 500 Å.

14. The structure of claim 1, wherein the gate dielectric has an interface state density less than approximately $1 \times 10^{11}$ eV$^{-1}$ cm$^{-2}$ and exhibits a leakage current less than approximately 10 nA/μm$^2$.

15. A method of forming a semiconductor structure, the method comprising the steps of:
   providing a strained Ge channel layer substantially free of undulations;
   providing a thin Si layer disposed over and in direct contact with the strained Ge channel layer;
   providing a gate dielectric disposed over and in direct contact with the thin Si layer; and
   providing a gate contact disposed over the gate dielectric, application of an operating voltage to the gate contact modulating movement of a plurality of charge carriers within the strained Ge channel layer,
   wherein a thickness of the thin Si layer is smaller than a thickness of the strained Ge channel layer and sufficiently small such that a majority of the plurality of charge carriers populate the strained Ge channel layer when the operating voltage is applied to the gate contact, thereby preserving the carrier mobility.

16. The method of claim 15, wherein the step of providing a strained Ge channel layer is performed at a temperature below approximately 550° C.

17. The method of claim 15, wherein the step of providing a thin Si layer comprises at least partially growing the thin Si layer at a temperature above approximately 400° C.

18. The method of claim 15, wherein the step of providing a gate dielectric comprises deposition.

* * * * *